(12) United States Patent
Amato (10) Patent No.: US 11,461,020 B2
(45) Date of Patent: Oct. 4, 2022

(54) MEMORY DEVICE EQUIPPED WITH DATA PROTECTION SCHEME

(71) Applicant: Micron Technology, Inc., Boise, ID (US)

(72) Inventor: Paolo Amato, Treviglio (IT)

(73) Assignee: Micron Technology, Inc., Boise, ID (US)

( * ) Notice: Subject to any disclaimer, the term of this patent is extended or adjusted under 35 U.S.C. 154(b) by 96 days.

(21) Appl. No.: 16/959,549

(22) PCT Filed: Oct. 9, 2019

(86) PCT No.: PCT/IB2019/000958
§ 371 (c)(1),
(2) Date: Jul. 1, 2020

(87) PCT Pub. No.: WO2021/069942
PCT Pub. Date: Apr. 15, 2021

(65) Prior Publication Data
US 2022/0004325 A1   Jan. 6, 2022

(51) Int. Cl.
*G06F 3/06*       (2006.01)
(52) U.S. Cl.
CPC .......... *G06F 3/0622* (2013.01); *G06F 3/0655* (2013.01); *G06F 3/0689* (2013.01)
(58) Field of Classification Search
CPC .... G06F 11/108; G06F 3/0689; G06F 3/0688; G06F 3/0685; G06F 3/0655;
(Continued)

(56) References Cited

U.S. PATENT DOCUMENTS 10,102,889 B2    10/2018  Bartling et al.
10,437,670 B1 *  10/2019  Koltsidas ............... G11C 29/52
(Continued)

FOREIGN PATENT DOCUMENTS

CN      1273901 C    9/2006
CN   103650054 B    2/2017
(Continued)

OTHER PUBLICATIONS

Office Action from related Taiwan Patent Application No. 109134921, dated Aug. 18, 2021, 15 pages.
(Continued)

*Primary Examiner* — Hashem Farrokh
(74) *Attorney, Agent, or Firm* — Brooks, Cameron & Huebsch, PLLC (57) ABSTRACT

The present disclosure relates to a memory device comprising a hybrid memory portion in turn comprising a main nonvolatile memory and an auxiliary nonvolatile memory, and a controller configured to store data information in the main nonvolatile memory. The controller of the present disclosure comprises a parity engine configured to accumulate temporary parity information in the auxiliary nonvolatile memory, the parity information being associated with the data information stored in the main nonvolatile memory; when the parity information accumulated in the auxiliary nonvolatile memory is complete, the parity engine is further configured to transfer the complete parity information from the auxiliary nonvolatile memory to the main nonvolatile memory. A related apparatus and a related method are also disclosed.

18 Claims, 8 Drawing Sheets

(58) Field of Classification Search
CPC ...... G06F 3/0622; G06F 3/061; G06F 3/0679;
G06F 3/0656; G06F 3/068; H03M
13/152; H03M 13/353; H03M 13/356;
H03M 13/1102
USPC ........................................................ 711/163
See application file for complete search history.

(56) References Cited

U.S. PATENT DOCUMENTS

| | | | |
|---|---|---|---|
| 10,437,674 B1 | 10/2019 | Sridhara et al. | |
| 11,099,986 B2* | 8/2021 | Mao | G06F 11/1068 |
| 2013/0279249 A1 | 10/2013 | Yun et al. | |
| 2015/0019933 A1 | 1/2015 | Yamazaki et al. | |
| 2015/0363263 A1* | 12/2015 | Hassner | H03M 13/152 |
| | | | 714/757 |
| 2016/0085625 A1* | 3/2016 | Amato | G06F 3/0679 |
| | | | 714/766 |
| 2016/0179611 A1 | 6/2016 | Le et al. | |
| 2016/0196216 A1* | 7/2016 | Lee | G06F 3/0689 |
| | | | 711/170 |
| 2019/0114222 A1 | 4/2019 | Amato et al. | |
| 2019/0114225 A1* | 4/2019 | Gopalakrishnan | G06F 11/1044 |

FOREIGN PATENT DOCUMENTS

| | | |
|---|---|---|
| CN | 104601178 B | 2/2018 |
| JP | 6381529 B2 | 8/2018 |
| TW | I605457 B | 11/2017 |
| TW | I361348 B | 4/2021 |

OTHER PUBLICATIONS

International Search Report and Written Opinion from related International Application No. PCT/IB2019/000958, dated Jul. 6, 2020, 13 pages.

* cited by examiner

| Old Value | New Value | Traditional Program Rule | New XOR Program Rule |
|---|---|---|---|
| 0 | 0 | 0 | 0 |
| 0 | 1 | 1 | 1 |
| 1 | 0 | 0 | 1 |
| 1 | 1 | 1 | 0 |

MEMORY DEVICE EQUIPPED WITH DATA PROTECTION SCHEME

TECHNICAL FIELD

The present disclosure relates to memory devices and more particularly to a memory device equipped with data protection scheme.

BACKGROUND

Memory devices are used in many electronic systems such as mobile phones, personal digital assistants, laptop computers, digital cameras and the like. Nonvolatile memories retain their contents when power is switched off, making them good choices for storing information that is to be retrieved after a system power-cycle.

Memory devices including nonvolatile flash memories, such as NAND memories, need a data protection scheme to protect data from system failure, providing for a possibility of rebuilding lost or corrupted data.

A known method for protecting data in memory devices is the use of Error Correction Code (ECC), which is however often not enough to recover full data information.

Another method to contain the loss-data problem is Redundant Array of Independent NAND (RAIN). RAIN methods store the parity Exclusive Or (XOR) sum of independent NAND, so that in an event of failure, the lost data may be recovered.

However, particularly in mobile applications, the controller of the memory devices usually accumulates partial parities into a dedicated buffer, so that there is the need to find a trade-off between SRAM size and write performance impact.

When parity is accumulated in the dedicated buffer, there is the need to save and restore partial parity at power-cycles. Moreover, after power loss, partial parities have to be rebuilt, which leads to reliability weakness, and no data protection is possible if a page read failure occurs during this operation.

It is therefore desirable to avoid these drawbacks, as well as to improve the operation of the controller of the memory devices, especially when RAIN protection is needed.

DETAILED DESCRIPTION

With reference to those drawings, systems and methods involving a memory device equipped with data protection scheme will be disclosed herein.

More particularly, as it will be described into details in the following, an example memory device comprises a hybrid memory portion including a main nonvolatile memory and an auxiliary nonvolatile memory, and a controller configured to store data information in the main nonvolatile memory, wherein the controller is configured to accumulate temporary parity information in the auxiliary nonvolatile memory, the parity information being associated with the data information stored in the main nonvolatile memory, and wherein, when the parity information accumulated into the auxiliary nonvolatile memory is complete, the controller is further configured to transfer the complete parity information from the auxiliary nonvolatile memory to the main nonvolatile memory.

Moreover, an example apparatus of the present disclosure comprises a host device and a memory device apt to communicate with the host device, the memory device comprising a hybrid memory portion including a main nonvolatile memory and an auxiliary nonvolatile memory, and a controller configured to store data information into the main nonvolatile memory, the controller including a front-end for interfacing with the host and a back-end for interfacing with the hybrid memory portion, wherein the back-end is structured into a first portion adapted to interface with the main nonvolatile memory and a second portion adapted to interface with the auxiliary nonvolatile memory, wherein the controller comprises a parity engine arranged to connect the first portion of the back-end with the second portion of the back-end and configured to accumulate temporary parity information in the auxiliary nonvolatile memory, said parity information being associated with the data information stored in the main nonvolatile memory, and wherein, when the parity information accumulated into the auxiliary nonvolatile memory is complete, the parity engine is configured to transfer the complete parity information from the auxiliary nonvolatile memory to the main nonvolatile memory The present disclosure also relates to a method for operating a memory device, comprising the steps of storing data information in a main nonvolatile memory, accumulating temporary parity information in an auxiliary nonvolatile memory, said parity information being associated with the data information stored in the main nonvolatile memory, and when the parity information is complete, transferring the complete parity information from the auxiliary nonvolatile memory to the main nonvolatile memory.

Nonvolatile memories retain their contents when power is switched off, making them good choices for storing information that is to be retrieved after a system power-cycle.

A Flash memory is a type of nonvolatile memory that retains stored data and is characterized by a very fast access time. Moreover, it can be erased in blocks instead of one byte at a time. Each erasable block of memory comprises a plurality of nonvolatile memory cells arranged in a matrix of rows and columns. Each cell is coupled to an access line and/or a data line. The cells are programmed and erased by manipulating the voltages on the access and data lines.

Figure 1:
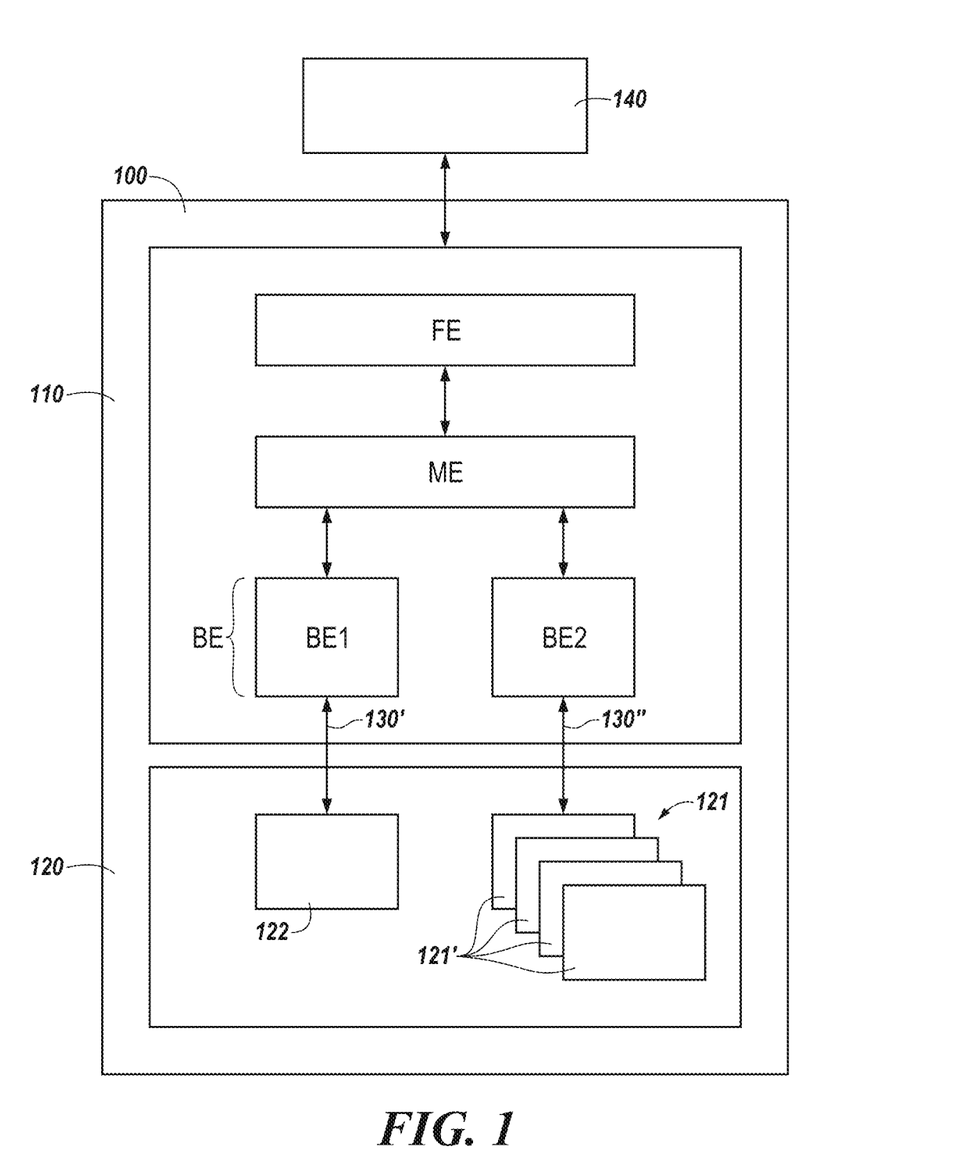
FIG. 1 is a high-level block diagram of the memory device according to the present disclosure.

FIG. 1 is a schematic block diagram of a memory device 100 according to the present disclosure.

The memory device 100 comprises a memory controller 110 and a hybrid memory portion 120 including a main nonvolatile memory 121 (herein referred to also as nonvolatile memory chip) for data storage.

According to an embodiment of the present disclosure, the main nonvolatile memory 121 comprises a plurality of NAND dies 121'.

Each NAND die 121' may comprise one or more Plane data structures. Each Plane data structure may comprise one or more Block data structures. Each Block may comprise multiple Physical Rows. Each Physical Row may comprise multiple Page data structures. In the NAND memory system, all the Planes may be active simultaneously. A single read access in a NAND system may involve one Page per Plane, where pages may be read simultaneously. An erase operation in a NAND memory system may involve one Block per Plane, where Blocks are also erased simultaneously.

The controller 110 can include an embedded firmware and is adapted to manage and control the operation of the hybrid memory portion 120. The controller 110 may be coupled to hybrid memory portion 120 through buses 130', 130". More in particular, the controller 110 is configured to store data information in the main nonvolatile memory 121.

An operating system OS and one or more applications may be executed on the controller 110. The OS of the controller 110 may request memory in the hybrid memory portion 120 on behalf of the one or more applications. In some embodiments, the controller 110 may be a system-on-chip (SOC) performing memory operations on the hybrid memory portion 120.

Clearly, the memory device 100 can also comprise other components, such as processor units coupled to the controller 110, antennas, connection means (not shown), and the like.

The controller 110 is responsible for interfacing the hybrid memory portion 120 with a host device 140 and for the programming of the memory device 100. In particular, the controller 110 is configured to communicate with the host device 140 and to exchange data information therewith.

According to an embodiment, the host device 140 is a mobile phone and the memory device 100 is a Universal Flash Storage (UFS) for data storage of said mobile phone.

Memory devices including flash memories, such as NAND memories, need a data protection scheme to protect data information from system failure.

A well-known method to contain the loss-data problem and manage on-field defectivity is Redundant Array of Independent NAND (RAIN). RAIN methods store the parity Exclusive Or (XOR) sum of data stored, so that in an event of failure, the lost data may be recovered, as it will be detailed in the following.

Usually, there are three kinds of failures that can be tackled by using RAIN, namely word line (WL) corruption due to program failures (PFs), normal Uncorrectable ECC (UECC), and lower page (LP) corruption due to asynchronous-power-loss (APL).

Advantageously according to the disclosure, the hybrid the memory portion 120 comprises, in addition to the main nonvolatile memory 121 an auxiliary nonvolatile memory 122, and the controller 110 is configured to accumulate in this auxiliary nonvolatile memory 122 temporary parity information associated with the data information stored in the main nonvolatile memory 121.

Figure 2:
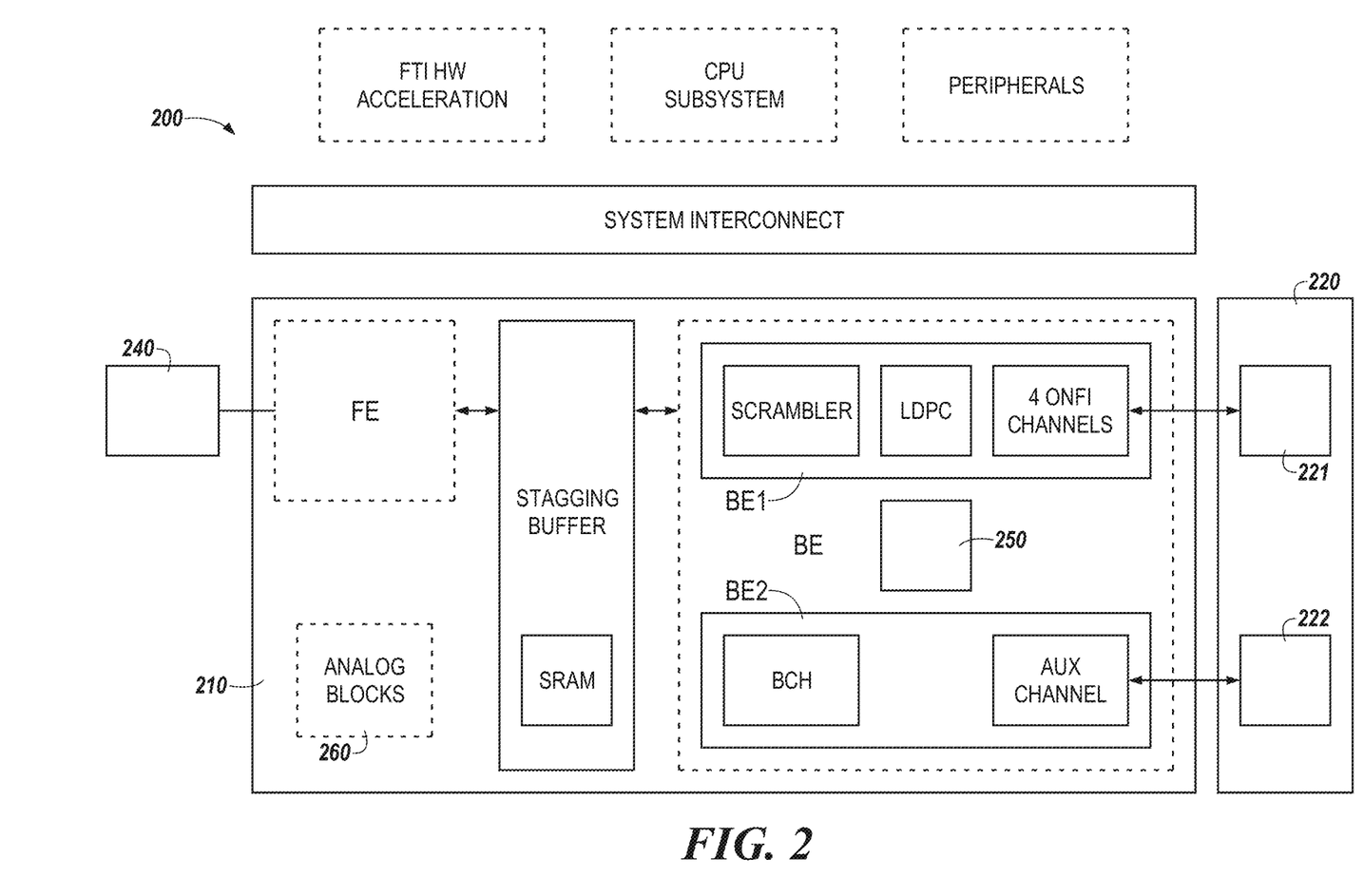
FIG. 2 is a more detailed high-level block diagram of the memory device according to an embodiment the present disclosure.

More particularly, referring now to memory device 200 of FIG. 2 (corresponding to the memory device 100 of FIG. 1), the controller 210 comprises a parity engine 250 configured to store the temporary parity information in the auxiliary nonvolatile memory 222 of the hybrid memory portion 220. The auxiliary nonvolatile memory 222 is therefore able to accumulate parity values when directed by a command from the controller 210, in particular from the parity engine 250.

In the following, the parity engine 250 will be referred to also as parity module or RAIN engine.

In other words, according to the present disclosure, memory parity calculation and storage schemes protect data information by using the controller 210 (in particular the parity engine 250) to calculate parity values, and then writing the generated parity values to the auxiliary nonvolatile memory 222 of the memory portion 220.

Advantageously, the controller 210 of the present disclosure is structured and programmed in such a way that system overhead during read and write operations to calculate and store parity are avoided, and a great efficiency is achieved.

According to an embodiment of the present disclosure, the auxiliary nonvolatile memory 222 of the memory portion 220 is a 3D X Point (3DXP) memory. The auxiliary nonvolatile memory 222 can also be a Phase Change Memory (PCM) or also a Chalcogenide-based memory or Self-Selecting Memory. However, the auxiliary nonvolatile memory function may also be provided by any other known or emerging technology memory type, such as Ferroelectric RAM (FeRAM), Spin Transfer Torque Magnetic RAM (STTMRAM).

In general, the requirements of the auxiliary nonvolatile memory 222 are low latency, bit alterability (for example for implementing embedded commands) and high density of the memory (e.g. at the giga level). In this respect, the 3DXP memory is the best candidate to act as auxiliary nonvolatile memory 222.

According to an embodiment of the disclosure, the controller 210 comprises a front-end FE configured to interface with the host device 240, a middle-end ME, and a back-end BE configured to interface with the hybrid memory portion 220, wherein the back-end BE is structured into a first portion BE1 adapted to interface with the main nonvolatile memory 221 and a second portion BE2 adapted to interface with the auxiliary nonvolatile memory 222, such portions communicating via suitable buses.

Furthermore, the memory device 200 may comprise other components, such as analog blocks 260 and other peripherals without limiting the scope of the disclosure. A volatile SRAM is included as in any traditional microcontroller.

According to an embodiment, the main nonvolatile memory may be configured to implement a low-density parity-check (LDPC) code as error correction code, while the auxiliary nonvolatile memory may be configured to implement a BCH code for encoding/decoding.

Referring again to the example of FIG. 2, all the data, before being written in the main nonvolatile memory, pass through a scrambler.

The possibility to accumulate temporary parity information in the auxiliary nonvolatile memory 222 is therefore advantageous because such memory is very reliable does not need RAIN protection and no trade-of trade-offs between SRAM size and write performance impact has to be found. The auxiliary nonvolatile memory 222 is therefore used as a RAM of the traditional solution but it is nonvolatile (and thus temporary parity information therein is maintained also in case of power loss) and has very low latency time. The efficient use of the auxiliary nonvolatile memory as a buffer is possible thanks to an improved architecture of the controller, as it will be disclosed below.

Figure 3:
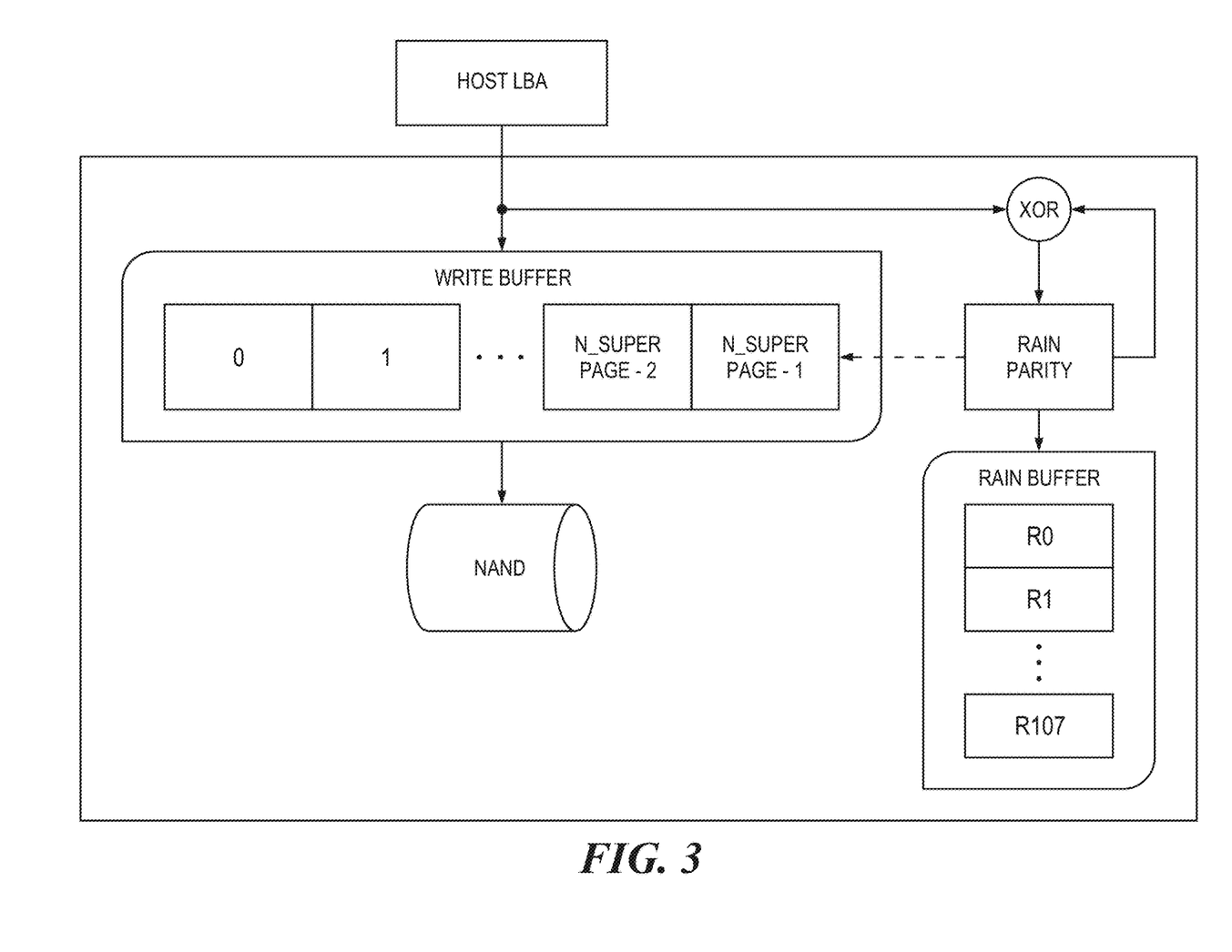
FIG. 3 illustrates a traditional parity calculation.

In order to highlight the advantages of the system and method of the present disclosure, a comparison with the traditional system and method is now performed. FIG. 3 illustrates the parity calculation for a traditional memory device, comprising a NAND flash memory. In such memory system, scaling nodes of NAND Flash technology under 20 nm deteriorates the reliability of the memory in such a way that the probability of on-field Word-Line (WL) shorts are not negligible. As previously mentioned, a well-known method to contain the loss-data problem caused by WL-WL shorts is RAIN, which stores the parity Exclusive Or (XOR) sum of independent NAND pages of a memory stripe area, so that in an event of failure, the lost data in the WL-WL short may be recovered.

As shown, the parity calculation is typically performed by accumulating intermediate parity values into a dedicated buffer, therefore having an impact on the performances of the RAM or SRAM. The XOR program is executed by summing all of the memory page structures to be protected. In other words, the parity P is calculated as:

$$P + \sum_{i=1}^{n} D_i = D_j + \sum_{i=1 (i \neq j)}^{n} D_i \quad (1)$$

where $D_1, D_2, \ldots D_j, \ldots, D_n$ are the data of the n pages (e.g., $D_i$ is the data of page i).

Saving the parity of n pages allows for recovering an original page of data from a page that may have been lost or corrupted. For example, data $D_j$ for page j may be recovered by subtracting the parity sum of all pages except page j from the total parity sum, P, as shown below:

$$D_j = P - \sum_{i=1 (i \neq j)}^{n} D_i \quad (2)$$

Especially in mobile applications, a multi-page RAIN is adopted, wherein the parity is calculated by the controller and then accumulated in a dedicated buffer before being written in the NAND, as shown in FIG. 3. As previously mentioned, a trade-offs between SRAM size and write performance impact has to be found, so that, for instance, 348 kB of SRAM size has an impact of 7%, 640 kB of SRAM size has an impact of 3.5%, and 4.6 MB of SRAM size has potentially no impact. Moreover, partial parity has to be saved and restored at power cycles, and after power loss, partial parities have to be rebuilt in SRAM, leading to reliability weakness: if there is a page read failure during this operation there is no RAIN protection. This traditional method has a very strong impact on the RAM performances.

Figure 4:
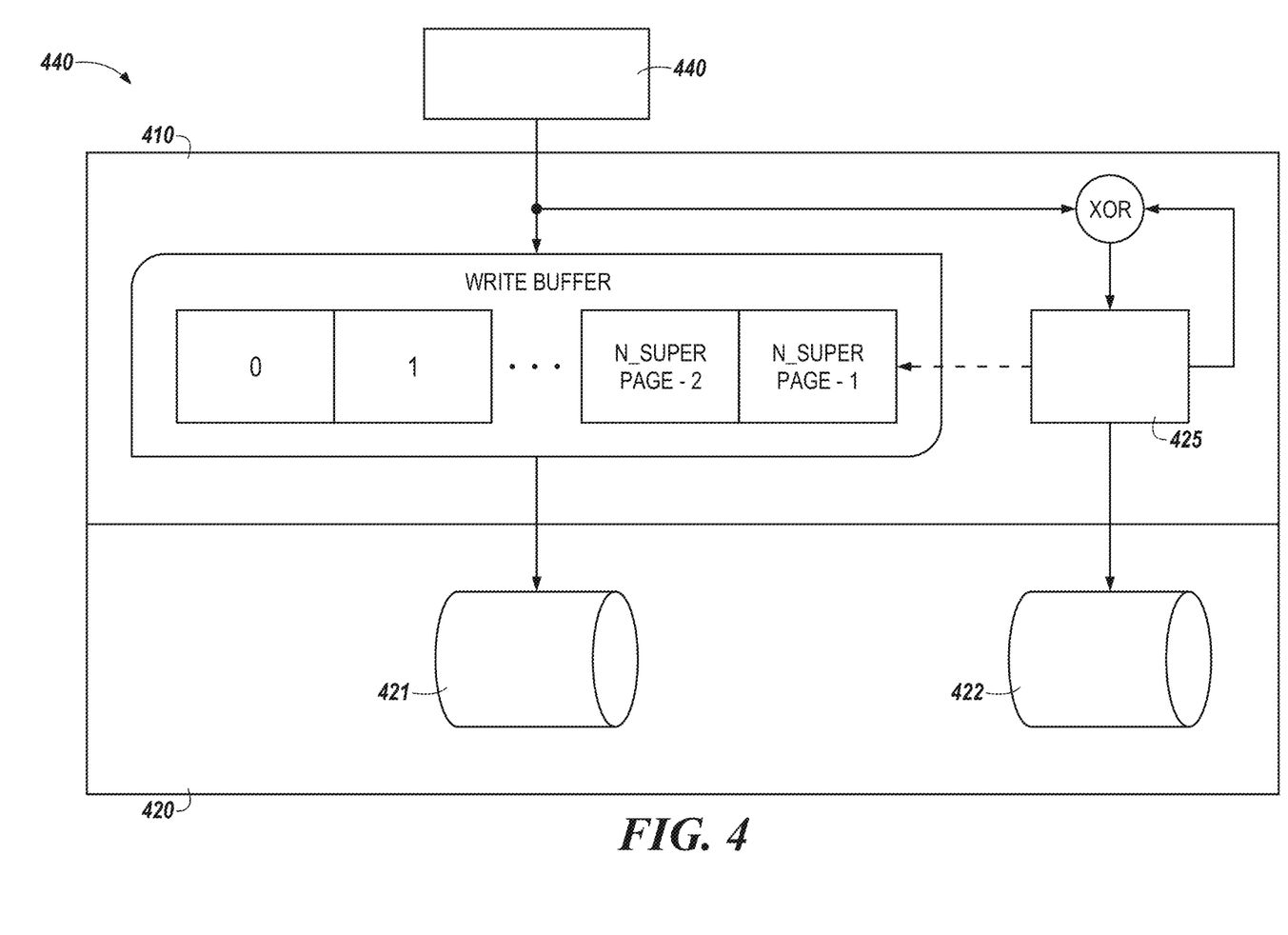
FIG. 4 illustrates a parity calculation according to the present disclosure.

According to the present disclosure, the above-mentioned drawbacks are overcome. As shown in FIG. 4, in the memory device 400 (corresponding to the memory devices 100 and 200 of FIGS. 1 and 2) the parity is calculated via the controller (specifically via the parity engine 450) according to the above formulas, and then temporary parity is accumulated in the auxiliary nonvolatile memory 422 while data information is stored in the main nonvolatile memory 421. Parity information is transferred from auxiliary memory 422 to main nonvolatile memory 421 when it is complete, obtaining many advantages, as it will be described in more details below.

Figure 5:
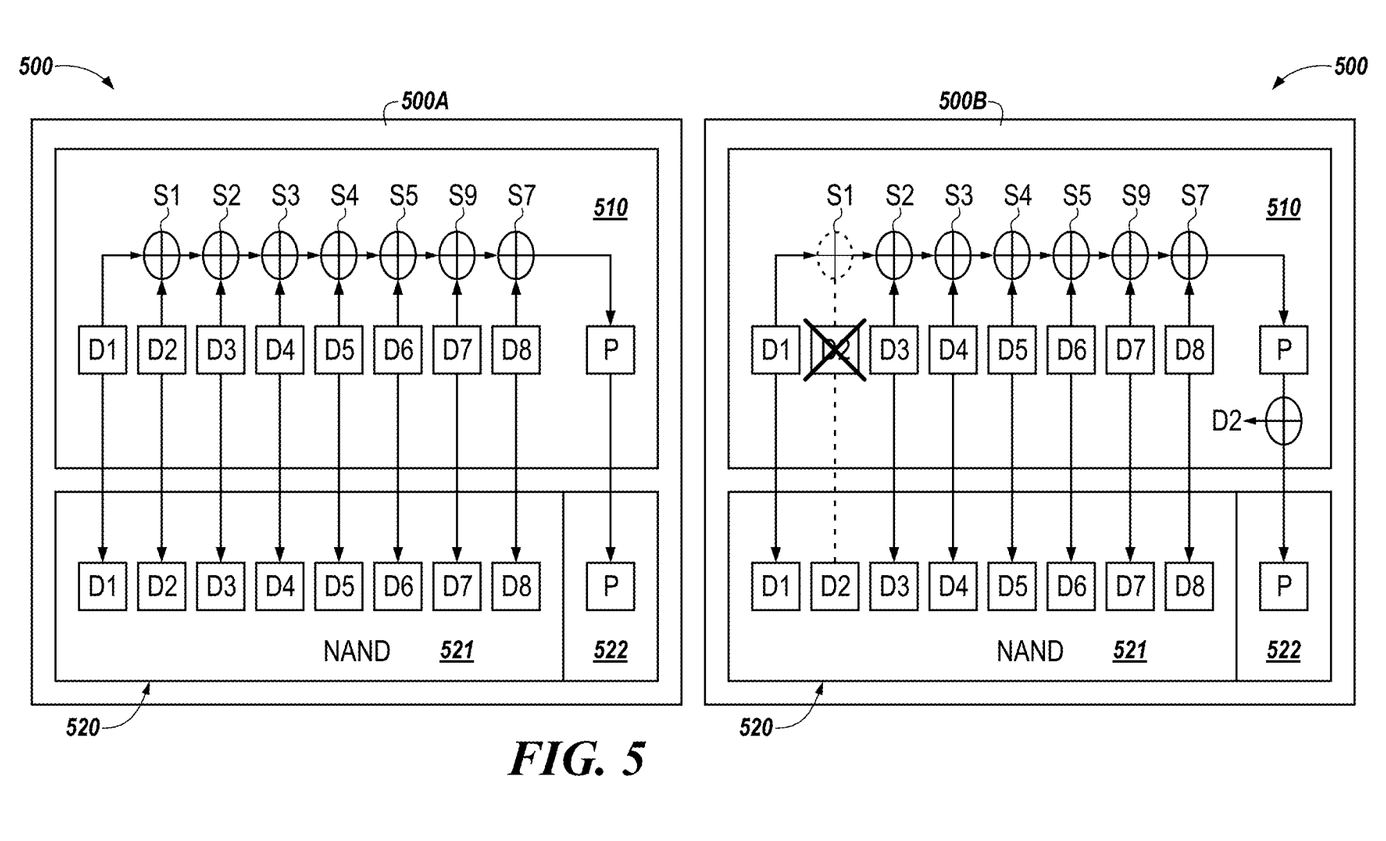
FIG. 5 illustrates logic for calculating parity in a memory device using an auxiliary nonvolatile memory to accumulate parity according to the present disclosure.

FIG. 5 illustrates logic for calculating parity in a memory device 500 using an auxiliary nonvolatile memory 522 to accumulate parity. In a logical representation of a RAIN parity value calculation and storage operation 500a, pages D1-D8 are summed by summers S1-S7 to produce a parity P for pages D1-D8 according to Equation 1 above. Pages D1-D8 are written to the main nonvolatile memory 521 and the new parity P is written to the auxiliary nonvolatile memory 522. Then, in a logical representation of a RAIN parity data restoration operation 500b, missing or corrupted data recovery of page D2 may comprise reading undamaged data pages D1 and D3-D8 from the main nonvolatile memory 521 and the parity value P from the auxiliary nonvolatile memory 522. Page recovery is performed by the controller 510 by comparing the partially recalculated parity value with the stored parity value according to Equation 2 in order to restore the original data page D2.

All the operations are performed in the controller of the memory device. As previously mentioned, advantageously, the controller according to the present disclosure comprises the parity engine which accumulates temporary partial parity information in the auxiliary nonvolatile memory, the parity information being associated with the data information stored in the main nonvolatile memory. Then, only when the parity information is complete, the parity engine is further configured to transfer the complete parity information from the auxiliary nonvolatile memory to the main nonvolatile memory, so that the parity is recalled only when it is complete and has to be sent to the main nonvolatile memory, i.e. to the NAND.

In other words, in response to the completion of the accumulated parity, the parity engine is arranged to connect the main nonvolatile memory and the auxiliary nonvolatile memory for the transfer of the total accumulated parity, greatly simplifying the operation of the controller.

Figure 6:
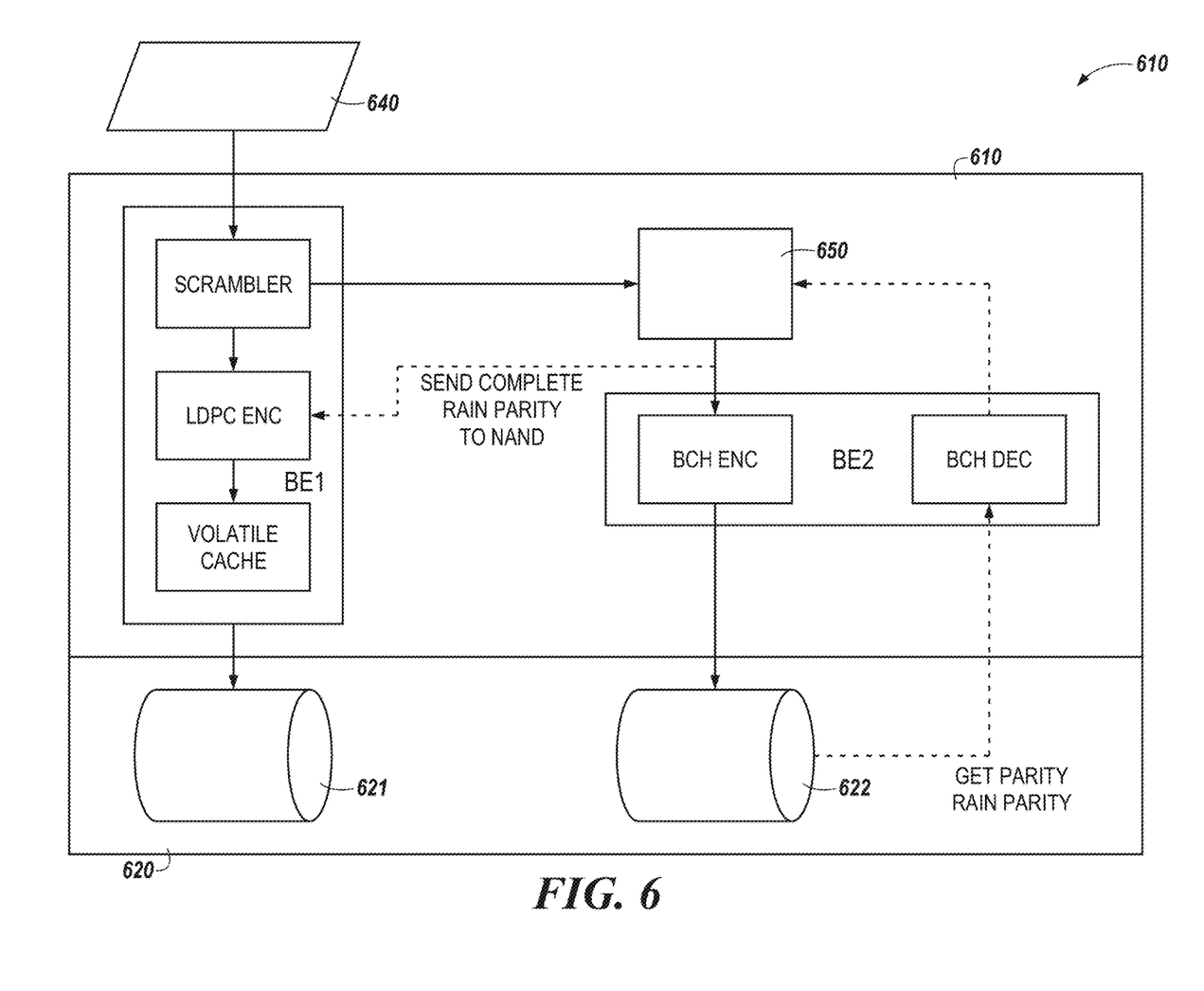
FIG. 6 schematically shows a write path implemented by the memory device according to the present disclosure.

Referring now to data path of the memory device 600 FIG. 6 (corresponding to the memory devices 100, 200, 400 and/or 500), the controller 610 comprises a front-end FE configured to interface with the host device 640 and a back-end BE configured to interface with the hybrid memory portion 620, wherein the back-end is structured into a first portion BE1 adapted to interface with the main nonvolatile memory 621 and a second portion BE2 adapted to interface with the auxiliary nonvolatile memory 622.

More in particular, advantageously according to the new controller configuration, the parity engine 650 lies at the intersection of the first portion BE1 of the back-end (i.e. the NAND back-end) and the second portion BE2 of the back-end (i.e. the auxiliary nonvolatile memory back-end). In this way, the parity engine 650 is arranged to connect the first portion BE1 of the back-end with the second portion BE2 of the-back end for the transfer of the complete parity information from the auxiliary nonvolatile memory 622 to the main nonvolatile memory 621. This improves the performances of the controller, as data are not accumulated in the RAM anymore, and the same time simplifying the operation of said controller.

In an embodiment, due to the improved architecture of the controller, the controller 610 is configured to store the data information in the main nonvolatile memory 621 simultaneously with the accumulation of the temporary parity information in the auxiliary nonvolatile memory 621. Moreover, the architecture of the controller allows for a simultaneous write operation in the main nonvolatile memory and read operation in the auxiliary nonvolatile memory.

As previously stated, the auxiliary nonvolatile memory is thus efficiently used to accumulate the temporary parity information, so that basically no space of the SRAM is used (only 32 kB are used to perform the accumulation of the temporary parity) and no RAIN buffer is used (since the auxiliary nonvolatile memory is used as a buffer). In an embodiment, the controller may also be configured to save the complete parity information into the auxiliary nonvolatile memory, so as to save space in the main nonvolatile memory, even if, especially in mobile application, it is preferred to transfer and save the complete parity to the main NAND memory.

Figure 7:
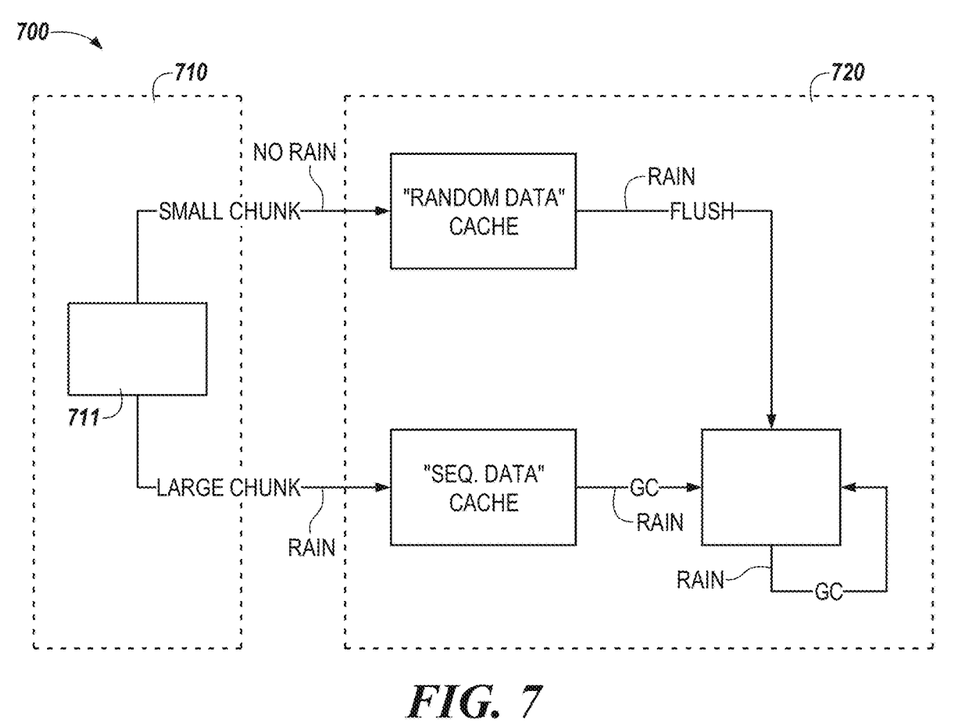
FIG. 7 schematically shows a write path implemented by the memory device according to an embodiment of the present disclosure.

In an embodiment, as shown in FIG. 7, based on the dimension and/or type of the data information to be written in the hybrid memory portion, the controller is configured to select whether to write the data information directly into the auxiliary nonvolatile memory, without accumulating parity information or to write the data information into the main nonvolatile memory, while accumulating parity information and transfer the parity from the auxiliary nonvolatile memory to the main nonvolatile memory once said parity is complete. The first option, i.e. a direct write in the auxiliary memory, could be useful for small chunk, while for large chunk it is preferable to write data information in the main nonvolatile memory.

More in particular, in the memory device 700 (corresponding to device 100, 200, 400, 500 and/or 600) of FIG. 7, the controller 710 comprises a volatile cache 711 where data information are accumulated before being written into the hybrid memory portion 720, and then, based on the data, the controller 710 selects the proper data path.

Summing up, according to the present disclosure, the controller of the memory device is configured to accumulate the temporary parity in the nonvolatile auxiliary memory, the parity being sent to the main NAND memory chip once it is completed. In this way, traditional multipage RAIN, in which the parity is written in a dedicated RAIN buffer of the SRAM, is avoided and only ~32 kB of the SRAM are now used for accumulating parity, due to the support of the auxiliary nonvolatile memory. This has no impact on write performance and no save/load operation at power cycles need to be performed, as the parity is accumulated in a nonvolatile memory, which can be chosen so as to be extremely reliable and not in the RAM. Moreover, there is no consequence due power loss and data can always be efficiently recovered.

The operation of the controller is extremely improved because the RAIN engine is arranged at the intersection of main NAND memory and the auxiliary nonvolatile memory back-end, so that the controller writes the total parity in the NAND only when the accumulated parity is complete. In this way, the data in the nonvolatile memory is recalled only when it is needed. In other words, the parity engine is configured to transfer data from the two nonvolatile memories when parity is complete and not each time the parity is to be updated. The controller architecture is therefore suitably modified so that the auxiliary nonvolatile memory is efficiently used a SRAM buffer, without impact on the system performances.

The present disclosure also provides for a further optimization of the memory controller, achieving an even more reduced system overhead during memory write and read operations respectively.

In particular, this second step of optimization provides for accumulating the parity calculation in the auxiliary nonvolatile memory itself by superimposing new (i.e. updated) parity data over old previously calculated parity information (or on empty memory locations in case no previous parity information is available). This introduces a new internal self-accumulating parity program component in the auxiliary nonvolatile memory for reducing time and power consumption by eliminating unnecessary reading and writing between the controller and the auxiliary nonvolatile memory. Execution of this internal program component is realized by introducing a new command in the auxiliary nonvolatile memory. In one embodiment, the program command is an "XOR program" command.

In particular, when the command "XOR program" is received (for example from the controller) with address and input data parameters, stored data is read at the input address and an XOR operation of the read data and new input data is performed and the results of the computation are written into memory, typically at same location of the input address received with XOR program command. However, a second address may be input with the command for storing the result of the XOR computation at a second address (e.g., read at the first address, and write at second address).

When the XOR command is received in operation, a program internal to the hybrid memory portion for computing and storing an XOR result of read data and input data is performed, e.g., by reading data stored at the input address, computing the XOR of the read data and the input data according to an XOR Program rule, and writing the result in memory.

In this case, the memory chip is suitably modified so that the self-Accumulating Exclusive OR Program accumulates the parity result in memory cells internal to the auxiliary nonvolatile memory system itself without intervention by the external controller. The program is thus directly executed by the memory chip after receiving a program command.

In other words, the hybrid memory portion is configured to execute an internal program in response to a program command from the controller, wherein the auxiliary nonvolatile memory, based on said internal program, is configured to store the parity information by overwriting old parity information with new parity information according to an Exclusive OR (XOR) program rule, wherein the auxiliary nonvolatile memory is apt to execute said internal command to overwrite or keep the old parity information without intervention from the controller, wherein the previous parity information is associated with first data information stored in the main nonvolatile memory and the updated parity information is associated with second data information different from the first data information.

The updated parity information is included in an accumulated parity sum of data stored in the memory system for recovering an original data from a corrupted data in the memory system.

More in particular, the memory portion is configured to overwrite the old parity information stored in the auxiliary nonvolatile memory with the new parity information regardless of a value of the old parity information if the new parity information has a first value, or to keep the old parity information at a same value if the new parity information has a second value, the second value being different from the first value.

This new modification to the memory chip allows achieving reduced system overhead during memory write and read operations in the memory system and to reduce time and power consumption.

In one exemplary embodiment, a 16 KB NAND page has a 4 planes per page architecture. Parity is a 16 KB vector calculated as $$P = \sum_{i=1}^{n} D_i \qquad (3)$$

where n=16 is the number of pages that are readable or programmable at a time. In other words, the stripe dimension is equal to a number of NAND die in the nonvolatile memory multiplied by the number of planes in each NAND device, while $D_i$ is the 16 KB page of the i-th plane. Because the parity sum is an exclusive logic sum (XOR), it is possible to retrieve lost data $D_j$, caused by a failure on the j-th page, by means of subtraction:

$$D_j = \sum_{i=1(i \neq j)}^{n} D_i - P \qquad (4)$$

Thus, it is also possible to write;

$$D_j = \sum_{i=1(i \neq j)}^{n} D_i + P \qquad (5)$$

(i.e. the lost data is the XOR of the saved parity with the parity calculated excluding the irretrievable page $D_j$).

The traditional program rule is modified inside the memory portion to create an XOR program rule for supporting a Self-Accumulating Exclusive OR Program. The Traditional Program Rule is shown in Table of FIG. 8, which is replaced by the new program rule, shown in the same Table of FIG. 8.

The XOR Program Rule according to the present disclosure allows the execution of the self-accumulating parity program to occur directly in the auxiliary nonvolatile memory, producing time and power savings in both partial write events and in the second XOR evaluation operation. The modified XOR Program Rule replaces the Traditional Program Rule shown, using temporary storage areas for calculations. In this way, the self-Accumulating Exclusive OR Program establishes a new program command in the auxiliary memory system, that uses the XOR Program Rule of FIG. 8 rather than the Traditional Program Rule.

Read and write performance conditions are determined by the characteristics of two channels shared by multiple NAND devices and one auxiliary memory memory system with serialized transmission of data, and independent NAND and auxiliary memory planes that can be written and read in parallel.

As previously mentioned, Self-Accumulating Exclusive OR Program system methodology begins by receiving the specific command. Then parity is accumulated in the auxiliary memory according to Equation 1 and the new XOR Program Rule of the table of FIG. 8, by superimposing previously stored parity information with new parity information.

Figure 8:
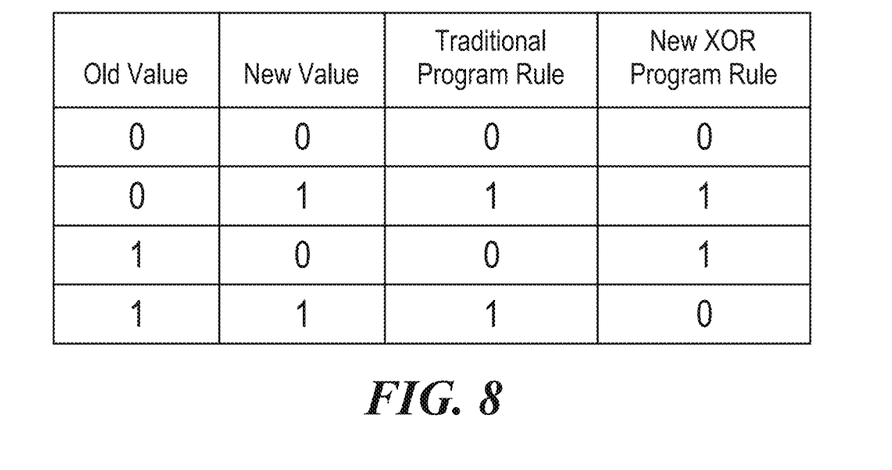
FIG. 8 is a table illustrating a command implemented by the memory device according to the present disclosure.

More in particular, according to the traditional program rule, when a previously stored parity bit has a value of 0 and a new parity bit value is also equal to 0, no new parity bit value is superimposed in an internal storage memory cell of the auxiliary memory system's parity value. When a previously stored parity bit has a value of 0 and a new parity bit value is equal to 1, a new parity bit value of 1 is superimposed in the corresponding internal parity memory cell of the auxiliary memory system over the previous value of 0. In other words, a Set operation is performed, wherein a Set operation refers to the operation of programming a bit to 1.

When a previously stored parity bit has a value of 1 and a new parity bit value is equal to parity bit value of 0, a 0 value is superimposed in the auxiliary memory system's internal parity storage memory cell. In other words, a Reset operation is performed, wherein a reset operation refers to the operation of programming a bit to 0. When a previously stored parity bit has a value of 1 and a new parity bit value is also equal to 1, no new parity bit value is superimposed in an internal storage memory cell of the auxiliary memory system's parity value (e.g., it remains at 1). However, these operations cannot be performed directly in the auxiliary memory.

Rather than the Traditional Program rule, Self-Accumulating Parity for Memory uses the new XOR program rule. The effect of the new XOR Program Rule is to realize an XOR operation directly in the memory device, saving time as well as power during partial writes and during the second operation of the RAIN XOR evaluation that sums parities for even and odd pages, while read accesses by the controller are eliminated entirely.

Each memory cell is pulsed according to the new XOR Program Rule. In contrast to the Traditional Program Rule, the new XOR Program Rule causes a reset pulse when the stored bit is equal to 1 and the new bit is also equal to 1. The XOR Program Rule causes a set pulse when the stored bit is equal to 0 and the new bit is equal to 1. In the remaining two cases where the new bit is equal to 0, the internal memory cell is not pulsed (so it remains at 0 or at 1). Therefore, when a previously stored parity bit has a value of 0 and a new parity bit value is equal to 1, a new parity bit value of 1 is superimposed in the corresponding internal parity memory cell of the auxiliary memory over the previous value of 0. In other words, a Set operation is performed, wherein a set operation refers to the operation of programming a bit to 1. When a previously stored parity bit has a value of 1 and a new parity bit value is equal to 0, no new parity bit value is superimposed in an internal storage memory cell of the auxiliary memory system's parity value (e.g., it remains at 1). When a previously stored parity bit has a value of 1 and a new parity bit value is also equal to 1, parity bit value of 0 is superimposed in the auxiliary memory system's internal parity storage memory cell. In other words, a Reset operation is performed, wherein a reset operation refers to the operation of programming a bit to 0. When a previously stored parity bit has a value of 0 and a new parity bit value is also equal to 0, no new parity bit value is superimposed in an internal storage memory cell of the auxiliary memory system's parity value (e.g., it remains at 0).

Thus, an auxiliary memory element is programmed to accumulate and store a parity sum by setting and resetting previously stored parity bit values according to conditions defined by an Exclusive Or (XOR) truth table, shown in FIG. 8, without intervention of the controller. Each newly calculated bit value is superimposed in the corresponding final internal bit storage location, (e.g., the parity memory cell) of the auxiliary memory system.

This internal read for XORing the current content of a page with a new data pattern has the great advantage that the reading of partial parities from the auxiliary nonvolatile memory is avoided.

More in particular, a reduced system overhead during write operations is obtained. In fact, during partial (or intermediate) write operations, the controller generates time and power overhead by reading the previous parity stored in the auxiliary memory. On the contrary, using the new Self-Accumulating Exclusive OR Program methodology, the existing parity data stored in the auxiliary memory may be up-dated at each partial write operation directly with the parity of page, or pages, written (for example directly with input data written in a single page Dk of NAND flash). Self-Accumulating Exclusive OR Program methodology eliminates reading of the previous parity stored in the auxiliary memory by the controller, eliminating the time and energy overhead during partial write operations.

Figure 9:
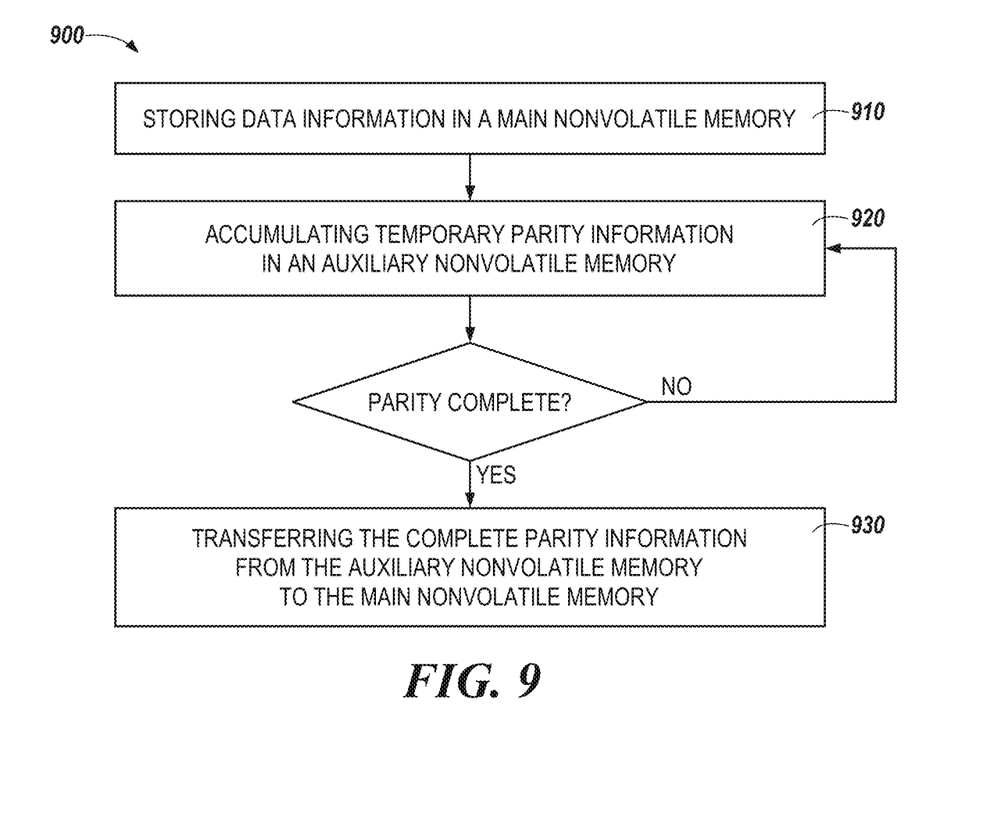
FIG. 9 is a flow diagram illustrating steps of a method according to the present disclosure.

Finally, according to the present disclosure, a method 900 for operating a memory device, comprises the step 910 of storing data information in a main nonvolatile memory, a step 920 of accumulating temporary parity information in an auxiliary nonvolatile memory, said parity information being associated with the data information stored in the main nonvolatile memory, and a final step 930 of transferring, when the parity information is complete, the complete parity information from the auxiliary nonvolatile memory to the main nonvolatile memory.

In the preceding detailed description, reference is made to the accompanying drawings that form a part hereof, and in which is shown, by way of illustration, specific examples. In the drawings, like numerals describe substantially similar components throughout the several views. Other examples may be utilized, and structural, logical and/or electrical changes may be made without departing from the scope of the present disclosure. In addition, as will be appreciated, the proportion and the relative scale of the elements provided in the figures are intended to illustrate the embodiments of the present disclosure and should not be taken in a limiting sense.

As used herein, "a," "an," or "a number of" something can refer to one or more of such things. A "plurality" of something intends two or more. As used herein, the term "coupled" may include electrically coupled, directly coupled, and/or directly connected with no intervening elements (e.g., by direct physical contact) or indirectly coupled and/or connected with intervening elements. The term coupled may further include two or more elements that co-operate or interact with each other (e.g., as in a cause and effect relationship).

Although specific examples have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. The scope of one or more examples of the present disclosure should be determined with reference to the appended claims, along with the full range of equivalents to which such claims are entitled.

The invention claimed is:

1. A memory device, comprising:
   a hybrid memory portion including a main nonvolatile memory and an auxiliary nonvolatile memory; and
   a controller configured to:
      store data information in the main nonvolatile memory;
      select whether to write the data information directly into the auxiliary nonvolatile memory without accumulating parity information or to write the data information into the main nonvolatile memory while accumulating parity information based on a dimension of the data information to be written in the hybrid memory portion, a type of the data information to be written in the hybrid memory portion, or a combination thereof;
      accumulate parity information in the auxiliary nonvolatile memory, the parity information associated with the data information stored in the main nonvolatile memory; and
      responsive to completion of accumulating the parity information into the auxiliary nonvolatile memory, transfer the complete parity information from the auxiliary nonvolatile memory to the main nonvolatile memory.

2. The memory device of claim 1, wherein the accumulated parity information is a Redundant Array of Independent NAND (RAIN) parity calculated by an Exclusive OR (XOR) program.

3. The memory device of claim 1, wherein the controller comprises:
   a front-end configured to interface with a host device; and
   a back-end configured to interface with the hybrid memory portion,
      wherein the back-end is structured into a first portion adapted to interface with the main nonvolatile memory and a second portion adapted to interface with the auxiliary nonvolatile memory.

4. The memory device of claim 3, further comprising a parity engine configured to connect the first portion of the back-end with the second portion of the-back end to transfer the complete parity information from the auxiliary nonvolatile memory to the main nonvolatile memory.

5. The memory device of claim 1, wherein the controller is configured to store the data information in the main nonvolatile memory simultaneously with the accumulation of the parity information in the auxiliary nonvolatile memory.

6. The memory device of claim 1, wherein the controller is configured to save the complete parity information into the auxiliary nonvolatile memory.

7. The memory device of claim 1, wherein the main nonvolatile memory comprises a plurality of NAND dies.

8. The memory device of claim 1, wherein the auxiliary nonvolatile memory is a 3D X Point (3DXP) memory.

9. The memory device of claim 1, wherein the auxiliary nonvolatile memory is a phase change memory (PCM) or a chalcogenide memory.

10. The memory device of claim 1, wherein the main nonvolatile memory is configured to implement a low-density parity-check (LDPC) code.

11. The memory device of claim 1, wherein the auxiliary nonvolatile memory is configured to implement a Bose-Chaudhuri-Hocquenghem (BCH) code.

12. The memory device of claim 1, comprising:
   the hybrid memory portion configured to execute an internal program in response to a program command from the controller;
   the auxiliary nonvolatile memory configured to:
      store, based on the internal program, the parity information by overwriting old parity information with new parity information according to an Exclusive OR (XOR) program rule; and
      execute the internal command to overwrite or keep the old parity information without intervention from the controller,
         wherein the previous parity information is associated with first data information stored in the main nonvolatile memory and the updated parity information is associated with second data information different from the first data information.

13. A method for operating a memory device, comprising:
   storing data information in a main nonvolatile memory;
   selecting, based on the dimension of data to be written, type of data to be written, or a combination thereof, whether to write the data information into the auxiliary nonvolatile memory without accumulating parity information or to write the data information into the main nonvolatile memory while accumulating parity information;

accumulating parity information in an auxiliary nonvolatile memory, the parity information associated with the data information stored in the main nonvolatile memory; and responsive to completion of accumulating the parity information, transferring the complete parity information from the auxiliary nonvolatile memory to the main nonvolatile memory.

14. The method of claim 13, comprising simultaneously storing data information in the main nonvolatile memory and accumulating parity information in the auxiliary nonvolatile memory.

15. The method of claim 13, comprising:
   executing, in a memory portion of the memory device, an internal program in response to a program command from a controller, wherein executing the internal program comprises:
      the auxiliary nonvolatile memory storing, based on the internal program, the parity information by overwriting old parity information with new parity information according to an Exclusive OR (XOR) program rule; and
      the auxiliary nonvolatile memory overwriting or keeping the old parity information without intervention from the controller responsive to the memory system receiving the program command, wherein:
         the previous parity information is associated with first data information stored in the main nonvolatile memory; and
         the new parity information is associated with second data information different from the first data information, the new parity information included in an accumulated parity sum of data stored in the memory portion for recovering an original data from a corrupted data.

16. The method of claim 15, comprising:
   overwriting the old parity information stored in the auxiliary nonvolatile memory with the new parity information regardless of a value of the old parity information responsive to the new parity information having a first value; and
   keeping the old parity information at a same value responsive to the new parity information having a second value different from the first value.

17. The method of claim 13, comprising
   passing the data information saved into the main nonvolatile memory through a data scrambler; and
   passing the data information and the accumulated complete parity information through a low-density parity-check (LDPC) encoder in the main nonvolatile memory.

18. An apparatus comprising:
   a host device; and
   a memory device coupled to the host device, the memory device comprising:
      a hybrid memory portion including a main nonvolatile memory and an auxiliary nonvolatile memory; and
      a controller configured to store data information into the main nonvolatile memory, and comprising:
         a front-end for interfacing with the host;
         a back-end for interfacing with the hybrid memory portion and structured into a first portion configured to interface with the main nonvolatile memory and a second portion adapted to interface with the auxiliary nonvolatile memory; and
         a parity engine configured to:
            connect the first portion of the back-end with the second portion of the back-end;
            select, based on the dimension of data to be written, type of data to be written, or a combination thereof, whether to write the data information into the auxiliary nonvolatile memory without accumulating parity information or to write the data information into the main nonvolatile memory while accumulating parity information;
            accumulate parity information in the auxiliary nonvolatile memory, the parity information associated with the data information stored in the main nonvolatile memory; and
            responsive to completion of accumulation of the parity information into the auxiliary nonvolatile memory, transfer the complete parity information from the auxiliary nonvolatile memory to the main nonvolatile memory.

* * * * *